(12) United States Patent
Chiang et al.

(10) Patent No.: US 6,781,225 B2
(45) Date of Patent: Aug. 24, 2004

(54) GLUELESS INTEGRATED CIRCUIT SYSTEM IN A PACKAGING MODULE

(75) Inventors: Kuo-Ning Chiang, Tao-Yen (TW); Wen-Hwa Chen, Hsin-Chu (TW); Kuo-Tai Tseng, Kao-Hsiang (TW)

(73) Assignee: ChipMOS Technologies Inc., Hsin-Chu (TW)

( * ) Notice: Subject to any disclaimer, the term of this patent is extended or adjusted under 35 U.S.C. 154(b) by 0 days.

(21) Appl. No.: 10/310,366

(22) Filed: Dec. 6, 2002

(65) Prior Publication Data

US 2003/0116862 A1 Jun. 26, 2003

Related U.S. Application Data

(63) Continuation of application No. 09/662,854, filed on Sep. 15, 2000, now abandoned.

(51) Int. Cl.$^7$ .................. H01L 23/02; H01L 23/495
(52) U.S. Cl. ............ 257/686; 257/735; 257/737; 257/778; 257/696; 257/668; 257/666; 257/723; 257/673; 257/690
(58) Field of Search .................. 257/686, 735, 257/778, 737, 780, 696, 723, 673, 668, 666

(56) References Cited

U.S. PATENT DOCUMENTS

| 4,862,322 | A | * | 8/1989 | Bickford et al. | 361/718 |
|---|---|---|---|---|---|
| 5,438,224 | A | * | 8/1995 | Papageorge et al. | 257/777 |
| 5,523,622 | A | * | 6/1996 | Harada et al. | 257/734 |
| 5,877,478 | A | * | 3/1999 | Ando | 257/777 |
| 6,236,109 | B1 | * | 5/2001 | Hsuan et al. | 257/688 |
| 6,650,019 | B2 | * | 11/2003 | Glenn et al. | 257/777 |

* cited by examiner

Primary Examiner—Nitin Parekh
(74) Attorney, Agent, or Firm—H. C. Lin

(57) ABSTRACT

An integrated circuit chip with ball-grid array solder balls is packaged as a module without being sealed in protective glue. The IC chip is mounted on an insulating substrate with pads to support the solder balls. The pads are connected to a second set of pads along the periphery of the substrate. Leads are pressed against the second set of pads for external connections. A second IC chip may be pressed against the other side of the substrate to increase the external connections.

3 Claims, 10 Drawing Sheets ial application Ser. No.
GLUELESS INTEGRATED CIRCUIT SYSTEM IN A PACKAGING MODULE This application is a continuation of application Ser. No. 09/662,854, filed Sep. 15 2000, abandoned.

BACKGROUND OF THE INVENTION (1) Field of Invention

This invention relates to integrated circuit (IC) module for packaging IC chips, in particular to ball-grid array IC chips.

(2) Description of the Related Art

In conventional packaging of integrated circuits (IC), protective glue is customarily used to seal the IC module to improve reliability. FIG. 10 shows a typical prior art IC module. An IC chip 50 is mounted on a metal frame with extensions 56 as leads. The IC chip 50 is wire-bonded to the leads 56. The IC chip 50 and the inner portions of the leads 56 are sealed in glue 54. The application of glue requires extra processing step and is therefore not cost effective.

SUMMARY OF THE INVENTION

An object of this invention is to eliminate the use of glue in sealing an integrated circuit module. Another object of this invention is to reduce the cost of packaging an IC chip or chips. Still another object of this invention is to eliminate the use of glue in sealing a ball-grid-array IC chip. A further object of this invention is to eliminate the use of glue in sealing a stacked multiple IC chip module.

These objects are achieved by pressure sealing an IC module. The bottom balls of a ball-grid array chip are mated with a first set of pads, which are connected to a second set of pads along the periphery of the package with extended leads for external connection. A frame of insulating material is placed over the second set of pads to seal to package. Alternatively, the IC chip itself may be used to press the leads to the second set of pads. The vacant space between the two sets of pads may be back-filled with insulating material.

DETAILED DESCRIPTION OF THE INVENTION

Figure 1:
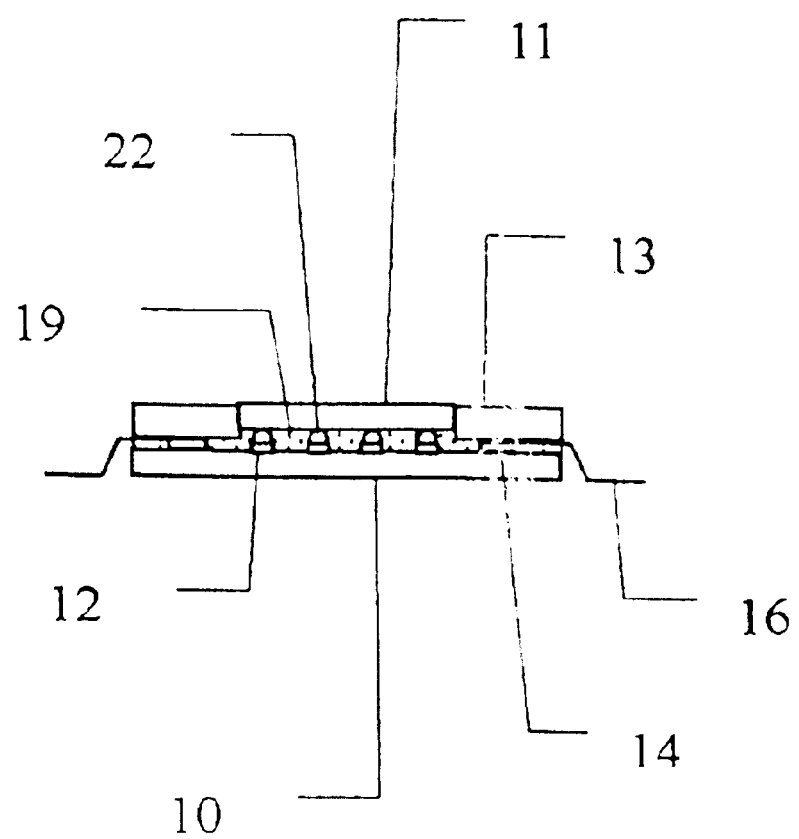
FIG. 1 shows the cross-section view of a package based on the present invention.

FIG. 1 shows the basic structure of the present invention. The substrate 10 has an array of first set of pads 12 to mate with the soldering balls 22 of the ball-grid array at the bottom of the IC chip 11. The substrate is printed with single-layered or multi-layered interconnections. The bonding pads 12 are wired to a set of bonding pads 14 lined along the periphery of the substrate 10. The bonding pads have extensions 16 for external connections 16. The extension leads 16 are pressed against the pads 14 by a pressure frame 13. The space 19 between the substrate 10 and the IC chip 11 can be back filled with material to improve the reliability of the module. The substrate should be a heat conducting insulating material, such as ceramic, glass, silicon, sapphire or GaAs to improve the reliability.

Figure 2:
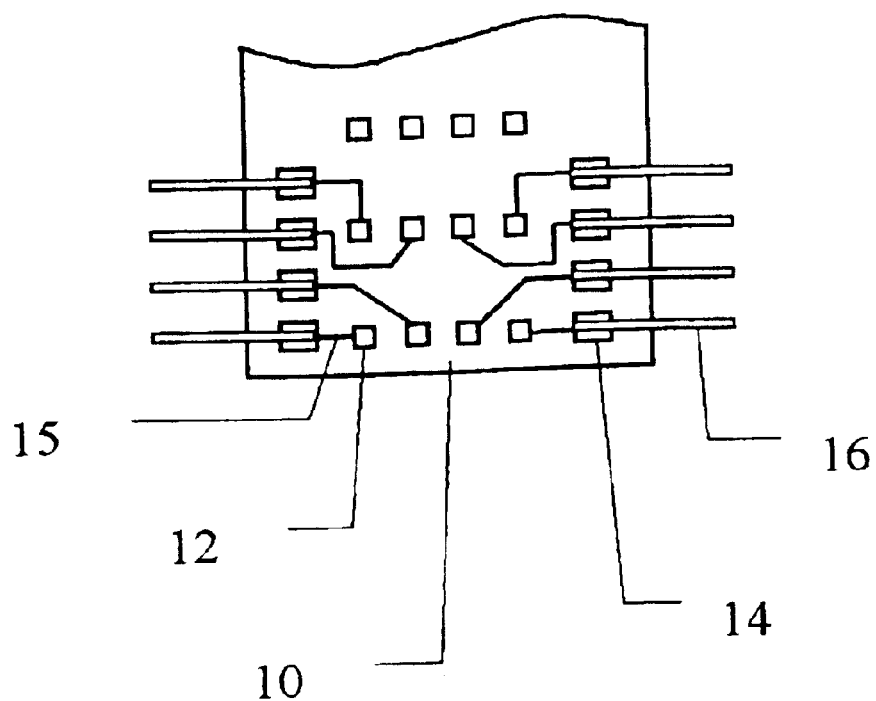
FIG. 2 shows the top view of the substrate of the package shown in FIG. 1.

FIG. 2 shows the top view of FIG. 1. The figure shows a set of centrally-located bonding pads 12 wired to the second set of pads lined along the periphery of the substrate 10. The metallic extension leads 16 are shown to line along two sides of the substrate 10. Actually, the leads can be lined along one side, two sides, three sides of the substrate. The leads may also be lined along both sides or four sides of the substrate.

Figure 3:
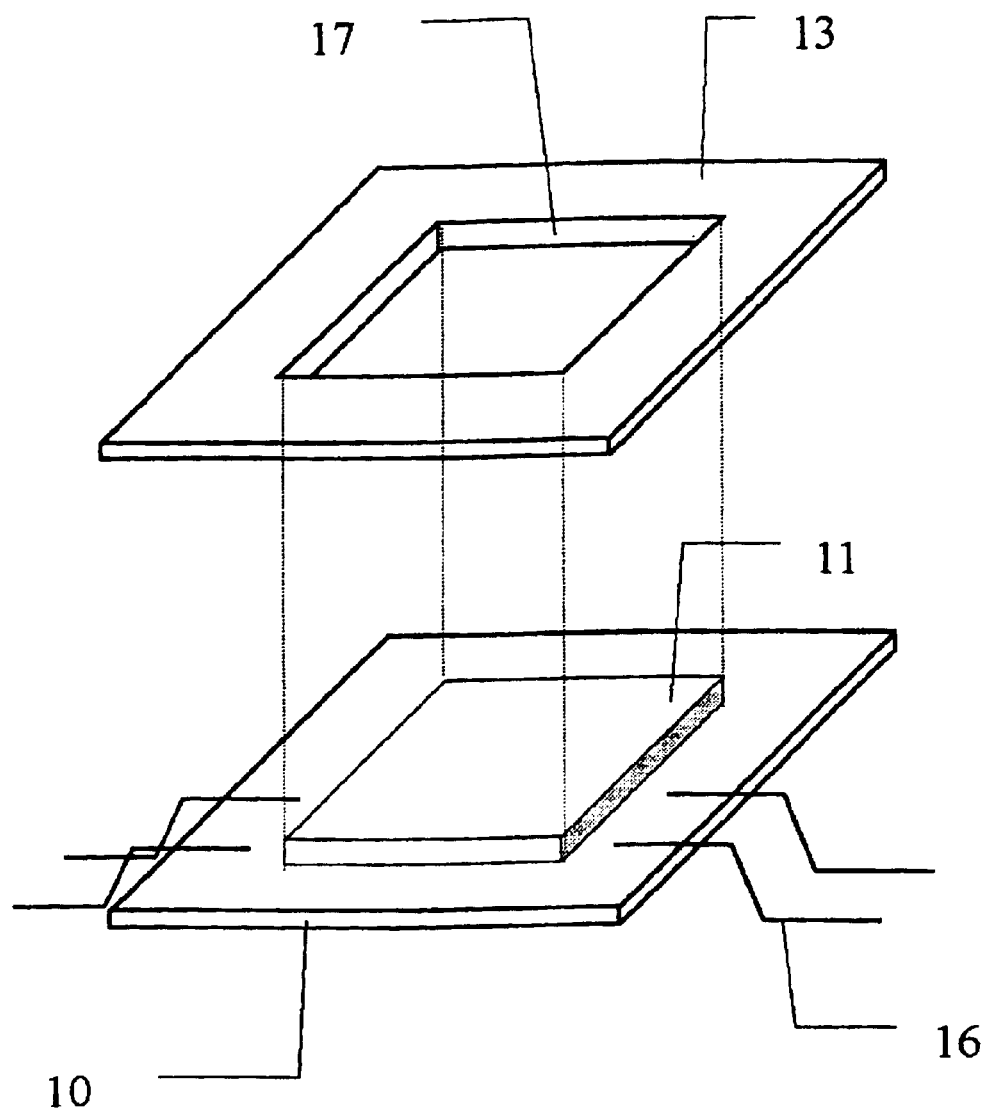
FIG. 3 shows a cover for pressing over the substrate shown in FIG. 2.

FIG. 3 shows the divided components of FIG. 1. A frame 13 is used to press down the extension leads 16 against the underlying pads. The frame has a hole 17 in the middle to accommodate the IC chip 11 shown in FIG. 1.

Figure 4:
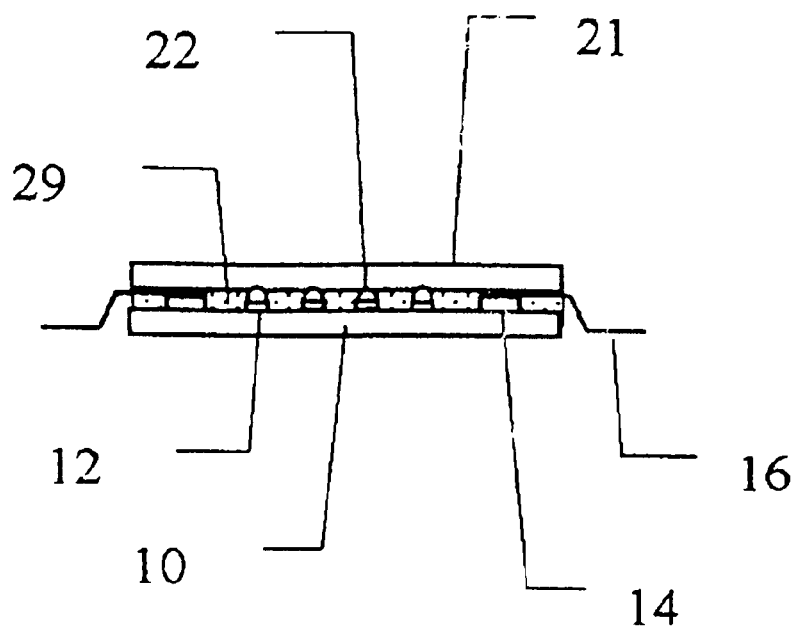
FIG. 4 shows the cross-section view of a package having the same width as the IC chip.

FIG. 4 shows a substrate 10 having sane overall dimension as the IC chip 21. The same reference numerals denote the same items as that in FIG. 1. When the IC chip 22 is of the same dimension as the substrate 10, the IC chip itself serve as a frame to press down extension leads 16 against the underlying pads. Space 29 between the bonding pads 12 can be back-filled with insulating material to improve reliability.

Figure 5:
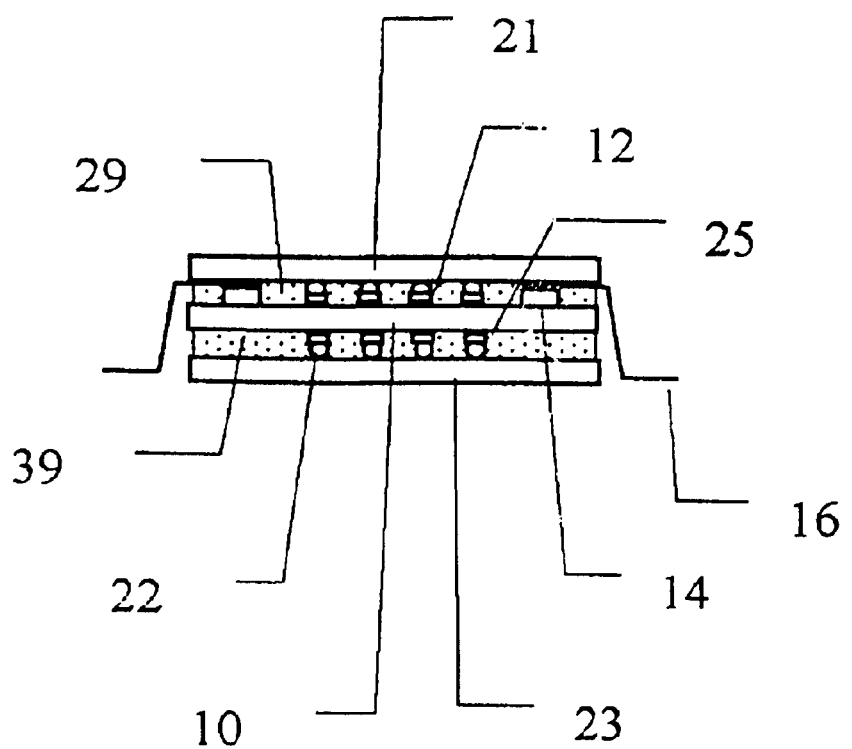
FIG. 5 shows the cross-section view of package with stacked IC chips.

FIG. 5 shows a substrate 10 with two-sided bonding pads 12, and 25. Two IC chips 21 and 23 pressed against the double-sided substrate 10. When the dimensions of the IC chips 21 and 23 are of the same dimension as the substrate 10, the IC chips are used to press the leads 16 against the bonding pads 14 for contact. Space 29 and space 39 between the bonding pads 12 can be back-filled with insulating material to improve reliability.

Figure 6:
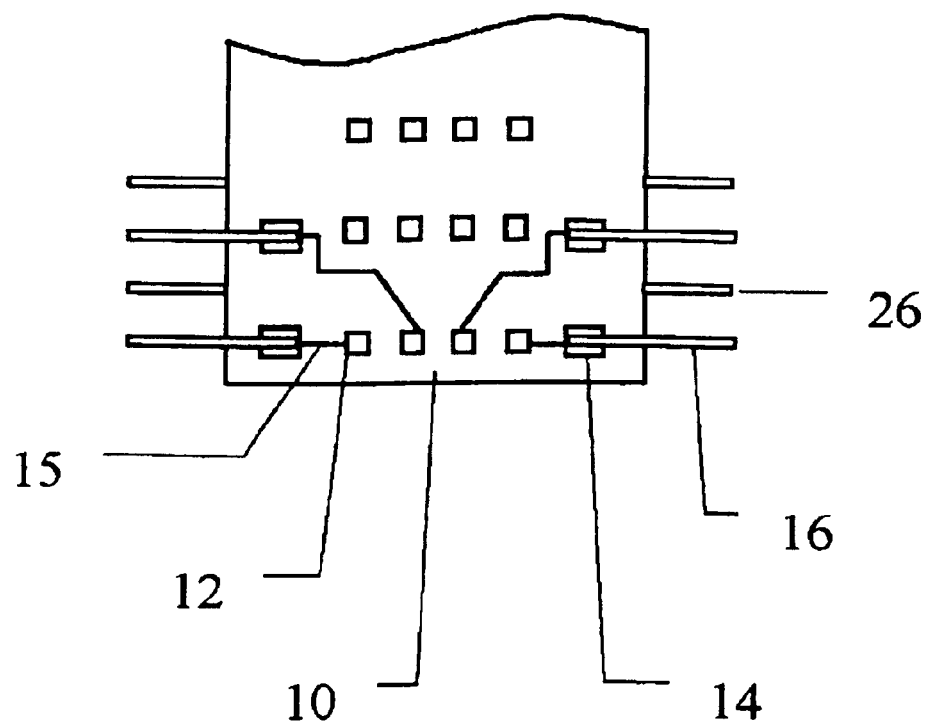
FIG. 6 shows the top view of a package with leads extending out from two-sides.
Figure 7:
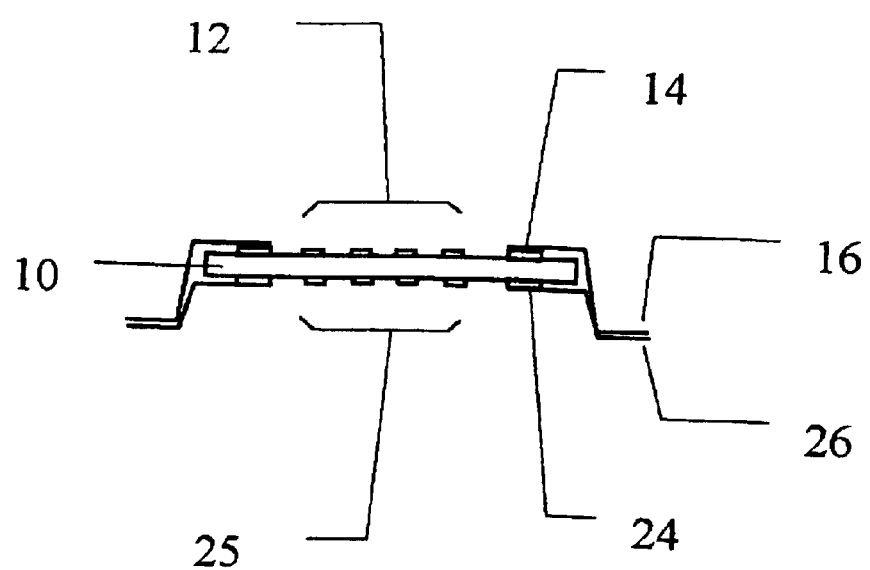
FIG. 7 shows the side view of the substrate in FIG. 5.

FIG. 6 shows the external leads of a double-sided substrate can be extended from both sides of the substrate 10 as leads 16 on one side and leads 26 on the other side. FIG. 7 is a cross-sectional view of FIG. 6. There are the centrally-located pads 12 wired to the peripheral pads 14 on the upper side of the substrate 10. There are the centrally-located pads 25 wired to the peripheral pads 24 on the other side of the substrate. The bottom side of the substrate has bonding pads 25 corresponding to bonding pads 12, and external connection pads 24 corresponding to external connection pads 14 described in FIG. 2. With two-sided leads, the number of the leads from the module can be increased. The leads such as 16 on one side of the substrate can be connected through conductor 15 to the odd-numbered bonding pads 14 on one side of the substrate 10, and the leads 26 on the other side of the substrate can be connected to the even-numbered bonding pads on the other side of the substrate.

Figure 8:
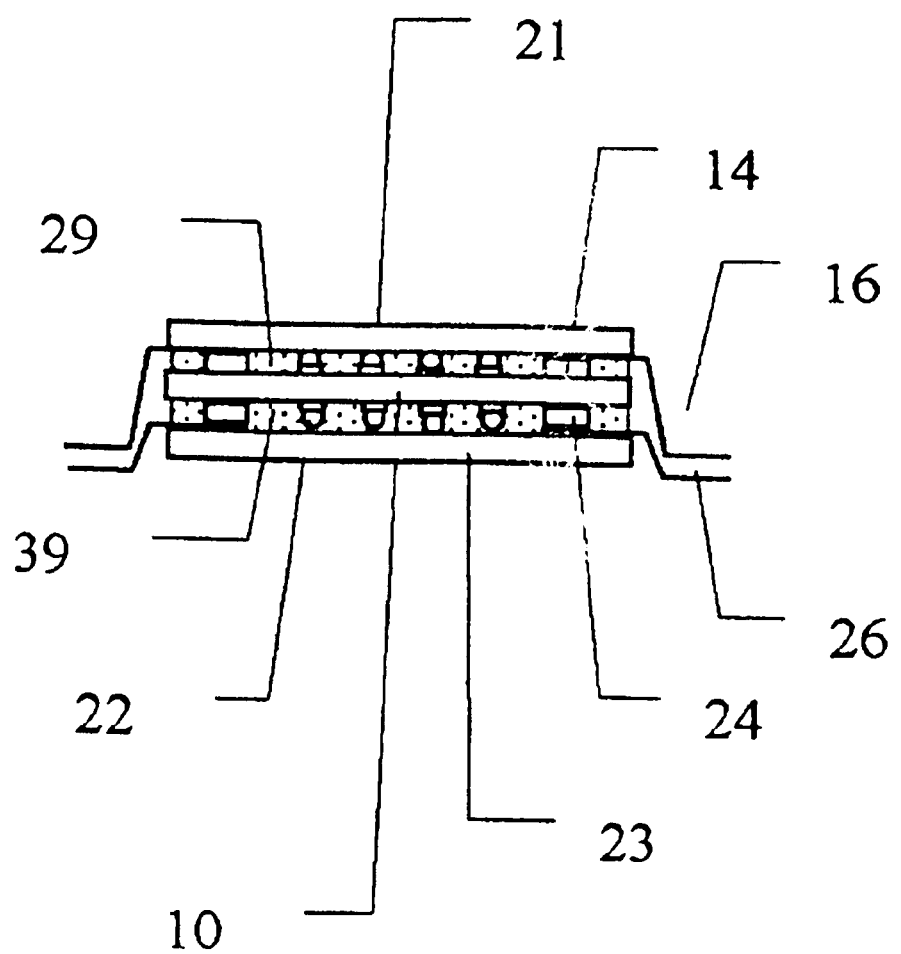
FIG. 8 shows a fourth embodiment of the present invention for a double-sided substrate.

FIG. 8 shows how the external leads 16 and 26 in FIG. 6 are brought out from both sides of the substrate 10. The position of the two sets of leads 16 and 26 are staggered to allow more space between leads on each side of the substrate. Space 29 between the bonding pads 12 can be back-filled with insulating material to improve reliability.

Figure 9:
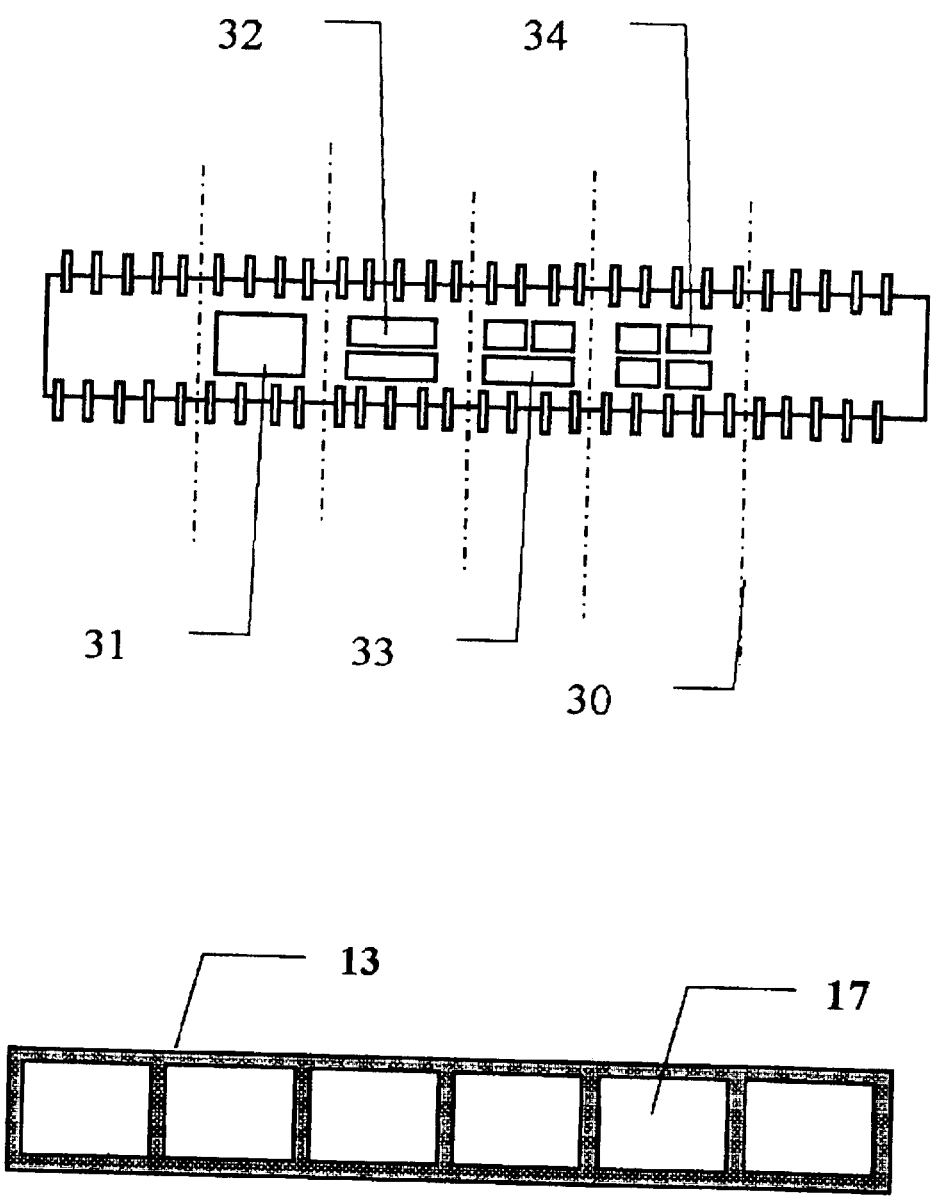
FIG. 9 shows the advantage of the present invention for multiple-chip packaging.
Figure 10:
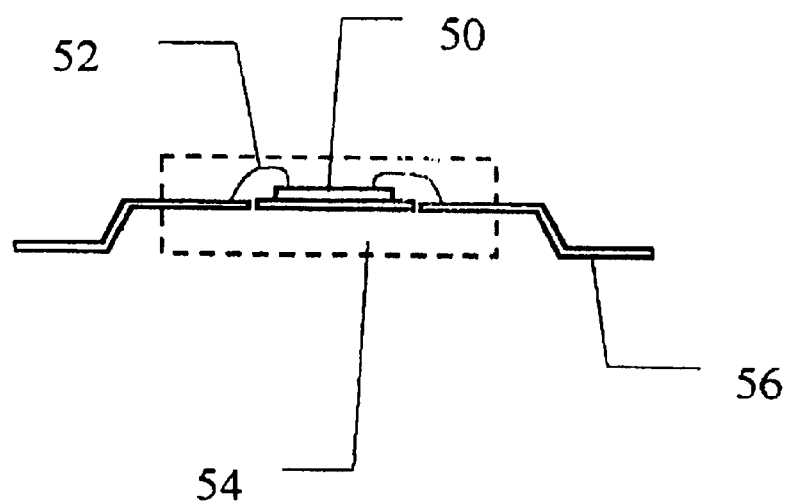
FIG. 10 shows a prior art in sealing an IC package with glue.

FIG. 9 shows how the IC modules of the present invention can be used to advantage for dual in-line multi-chip packages. The IC chip 11 can be packaged as module 31. Two IC chips can be packaged as module 32. Three IC chips can be packaged as module 33. Four IC chips can be packaged as module 34. These chips are all pressed by a frame 13 like the individual press 13 in FIG. 3 for the leads to make contact with the IC chips, which occupy the windows 17 of the frame 13. Then the common substrate is sawed along the dot-dash line 30 to yield individual multi-chip packages.

While particular embodiments of the invention have been described, it will be apparent to those skilled in the art that various modifications may be made without departing from the spirit of the present invention. Such modifications are all within the scope of this invention.

What is claimed is:

1. A glueless integrated circuit (IC) module, comprising:

an IC chip with ball-grid array solder contacts;

an insulating substrate having a top side and a bottom side;

a first set of pads on the top side of said substrate to mate with said solder contacts;

a second set of pads along the edge of said substrate wired to said first set of pads;

a first set of leads mating with said second set of pads and extending outside said module for an external connection, and pressed against said second set of pads directly by said IC chip to make electrical contacts;

the bottom side of said substrate having a second chip with a second set of ball-grid array solder contacts, a third set pads which mate with said second set of ball-grid array solder contacts and a fourth set of pads along the edge of said substrate wired to said third set of pads; and a second set of leads for external connection and pressed against said second set of pads directly by said second chip to make electrical contacts.

2. The glueless IC module as described in claim 1, wherein said second set of leads are staggered with respect to the first set of leads.

3. The glueless IC module as described in claim 1, further comprising an insulating material being filled on the top side and the bottom side of the said substrate between the said substrate and said IC chip and said second IC chip respectively.

* * * * *